(12) United States Patent
Chiang et al.

(10) Patent No.: US 8,295,086 B2
(45) Date of Patent: *Oct. 23, 2012

(54) MEMORY ARRAY

(75) Inventors: Chih-He Chiang, Hsinchu (TW);
Chung-Kuang Chen, Hsinchu (TW);
Han-Sung Chen, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/180,854

(22) Filed: Jul. 12, 2011

(65) Prior Publication Data

US 2011/0267881 A1    Nov. 3, 2011

Related U.S. Application Data

(63) Continuation of application No. 12/398,397, filed on Mar. 5, 2009, now Pat. No. 8,004,899.

(51) Int. Cl.
*G11C 16/04*    (2006.01)
(52) U.S. Cl. .......... 365/185.13; 365/185.11; 365/185.18
(58) Field of Classification Search ............. 365/185.13, 365/185.25, 185.15, 185.16, 185.11, 185.18
See application file for complete search history.

(56) References Cited

U.S. PATENT DOCUMENTS 8,004,899 B2 *   8/2011   Chiang et al. ............ 365/185.13
* cited by examiner

*Primary Examiner* — Alexander Sofocleous
*Assistant Examiner* — Hien Nguyen
(74) *Attorney, Agent, or Firm* — J.C. Patents

(57) ABSTRACT

A memory array is shown, including memory cells with source and drain doped regions, and global bit lines coupled to the doped regions via select transistors. The connections of the select transistors are configured such that the respective loading capacitances of two global bit lines respectively coupled to the source and the drain of a memory cell to be read do not vary with the memory cell to be read.

8 Claims, 4 Drawing Sheets

MEMORY ARRAY

CROSS-REFERENCE TO RELATED APPLICATION

This application is a continuation application of and claims priority benefit of the application Ser. No. 12/398,397, now U.S. Pat. No. 8,004,899, filed on Mar.5, 2009. The entirety of the above-mentioned patent application is hereby incorporated by reference herein and made a part of this specification.

BACKGROUND OF THE INVENTION

1. Field of Invention

This invention relates to architecture of integrate circuits and operation thereof, and more particularly relates to a memory array structure that is suitably applied to a virtual-ground memory array, and to a method of operating a memory.

2. Description of Related Art

For non-volatile memory (NVM), a virtual ground array structure can be adopted to save the array area due to removal of device isolation. However, there are some drawbacks for the virtual-ground array if source side sensing is adopted in the reading.

FIG. 1 depicts a virtual-ground NVM array in the prior art. For, example, when the left side of the cell X1 is selected to read, the word line $WL_n$ is biased between the threshold voltages of two storage states, the select line SEL2 set high to pass the drain voltage $V_d$ from the global bit line GBL0, and SEL1 set high to pass the source-side charging voltage which is used to judge the cell current 110. The global bit line GBL1 is charged from ground to a certain voltage ($V_s$) according to the magnitude of the cell current, and the sensing is done as GBL1 is at about 50-200 mV.

However, when the cells X2-X5 are all at the lower-Vt state, their channels are all turned on by the voltage on $WL_n$ so that a current path 120 is formed, through the select transistor coupled to SEL2 and the global bit line GBL2, to charge GBL2, and another current path 130 is also formed. The charging-induced voltage on GBL2 couples to the neighboring GBL1, so that the loading capacitance of GBL 1 is changed. As a result, wrong read behavior is easily caused, especially when the sensing window is narrower in a multi-level cell (MLC) application.

The variation of the loading capacitance can be reduced by setting more select lines and increasing the distance between the possibly charged global bit lines and the two global bit lines for reading. FIG. 2 depicts such a virtual-ground NVM array in the prior art. For example, when the left side of the cell X1 is to be read with the global bit lines GBL1 and GBL2 biased, a cell current 210 is formed, and two charging currents 220 and 230 may be formed. The nearest possibly charged global bit line is GBL5, which is quite distant from GBL2 and does not affect the latter if charged.

However, there is still considerable variation in GBL loading capacitance for the above memory array structure. For example, as shown in Table 1 below, when the left side of X1 is to be read, GBL1 is the source side, GBL2 is the drain side, and GBL0 neighboring to GBL1 is floated. When the left side of X3 is to be read, GBL3 is the source side, GBL0 is the drain side, GBL4 neighboring to GBL3 is floated, and GBL1 and GBL2 are floated. Accordingly, the source-side and drain-side GBL loading capacitances are changed when a different memory cell is to be read. Thus, wrong read behavior is still easily caused, especially when the sensing window is narrower in an MLC application.

TABLE 1

|  | GBL0 | GBL1 | GBL2 | GBL3 | GBL4 | GBL5 | GBL6 | GBL7 |
|---|---|---|---|---|---|---|---|---|
| Left side of X1 | $^a$F | $V_s$ | $V_d$ | F | F | F | F | F |
| Left side of X3 | $V_d$ | F | F | $V_s$ | F | F | F | F |

$^a$: F = Floated

SUMMARY OF THE INVENTION

In view of the foregoing, this invention provides a memory array, which may be a virtual-ground memory array and can prevent changes in the loading capacitances of global bit lines when a different cell is to be read.

This invention also provides a method of operating a memory, which is suitably applied to the memory array of this invention.

The memory array of this invention includes a plurality of memory cells with doped regions as sources and drains, a plurality of word lines each coupled to the gate electrodes of a row of memory cells, a plurality of local bit lines each coupled to a column of doped regions, and a plurality of global bit lines (GBL) coupled to the local bit lines via a plurality of select transistors. The connections of the select transistors are configured such that the source and the drain of any memory cell to be read are coupled to two neighboring global bit lines respectively and the nearest global bit line possibly charged in reading of the memory cell is separated from the two neighboring global bit lines by at least one other global bit line.

The latter limitation concerning the nearest possibly charged global bit line can be achieved by having the select transistors coupled to any four or more consecutive global bit lines each coupled to a different select line.

In an embodiment of the memory array of this invention, the select transistors are controlled by a plurality of select lines. Among the global bit lines, a first global bit line is coupled to a first select transistor controlled by a first select line, a second global bit line neighboring to the first global bit line is coupled to a second select transistor controlled by a second select line, and a third global bit line separated from the second global bit line by at least one other global bit line is coupled to a third select transistor controlled by the first select line.

In the above embodiment, a fourth global bit line neighboring to the third global bit line may be couple to a fourth select transistor controlled by the second select line.

The method of operating a memory of this invention is applied to a memory that comprises a plurality of memory cells each having a gate electrode, a source doped region and a drain doped region, a plurality of word lines each coupled to the gate electrodes of a row of memory cells, a plurality of local bit lines each coupled to a column of doped regions, a plurality of global bit lines, and a plurality of select transistors configured to connect the global bit lines to the local bit lines. A read voltage is applied to the word line coupled to the gate electrode of the selected memory cell to be read. A drain voltage is applied to the drain of the selected memory cell, via a first global bit line, a first select transistor that is coupled between the first global bit line and a first local bit line coupled to the drain, and the first local bit line. A source voltage is applied to the source of the selected memory cell, via a second global bit line neighboring to the first global bit line, a second select transistor that is coupled between the second global bit line and a second local bit line coupled to the source, and the second local bit line. A third select transistor, which is coupled to a third global bit line separated from the first and the second global bit lines by at least one other global bit line, is turned on. The cell current of the selected memory cell is sensed to determine the storage state of the selected memory cell. It is particularly noted that the former four steps are not necessarily performed in the above sequence.

In the above memory array of this invention, since the source and the drain of any memory cell to be read are coupled to two neighboring global bit lines respectively, the global bit line with the source voltage is always located between the global bit line with the drain voltage and a floated unselected global bit line, and the global bit line with the drain voltage is always between the global bit line with the source voltage and another floated unselected global bit line. In combination with the arrangement that the nearest global bit line possibly charged in the reading is separated from the two neighboring global bit lines by at least one other global bit line, the loading capacitances of global bit lines do not change when a different memory cell is to be read, thereby preventing wrong read behavior.

In order to make the aforementioned and other objects, features and advantages of the present invention comprehensible, a preferred embodiment accompanied with figures is described in detail below.

DESCRIPTION OF EMBODIMENTS

In the virtual-ground NVM array according to this embodiment, there are two features to achieve unvaried GBL loading capacitances. The first feature is that the source and the drain of any memory cell to be read are coupled to two neighboring global bit lines respectively. The second feature is that the nearest global bit line possibly charged in reading of the memory cell is separated from the two neighboring global bit lines by at least one other global bit line.

The second feature may be achieved by having the select transistors coupled to the two neighboring global bit lines, those coupled to the global bit line neighboring to one of the two neighboring global bit lines and those coupled to the global bit line neighboring to the other of the two neighboring global bit lines are each coupled to a different select line. Accordingly, when the select transistors coupled to any set of a number "$N_1$" ($\geq 4$) of consecutive global bit lines are each coupled to a different select line, the above-mentioned second feature of this embodiment can be achieved.

In the above case, it is possible to make the nearest possibly charged global bit line separated from the two neighboring global bit lines for reading a cell by a fixed number "$N_2$" ($1 \leq N_2 < N_1$) of other global bit line(s). This can be achieved by having the correspondence relationship between doped regions and global bit lines and that between doped regions and select lines both fixed for every repeating unit of memory cells.

More specifically, a fixed number "$N_3$" ($N_3 > N_1$) of consecutive memory cells in a row constitute a repeating unit, with $N_3$ doped regions thereof arranged from one side of the $1^{st}$ cell to between the ($N_3-1$)-th cell and the $N_3$-th cell. The $N_3$ doped regions are coupled, in a first correspondence relationship, to the $N_1$ global bit lines via $N_3$ select transistors coupled to $N_3$ different select lines, and thus have a second correspondence relationship with the $N_3$ select lines. The $N_3$ doped regions in any other repeating unit are coupled to another set of $N_1$ global bit lines in the first correspondence relationship, and have the second correspondence relationship with the $N_3$ select lines.

Figure 1:
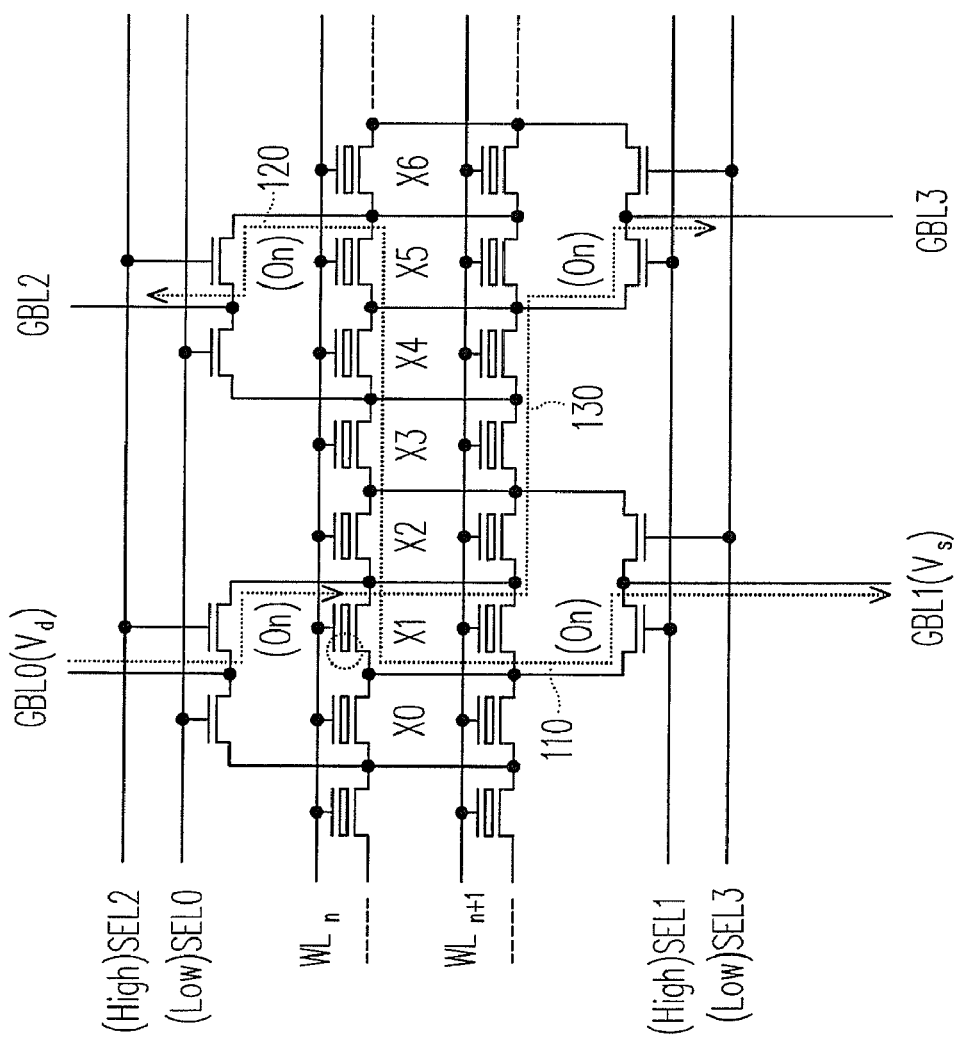
FIGS. 1-2 depict two virtual-ground NVM arrays in the prior art.
Figure 2:
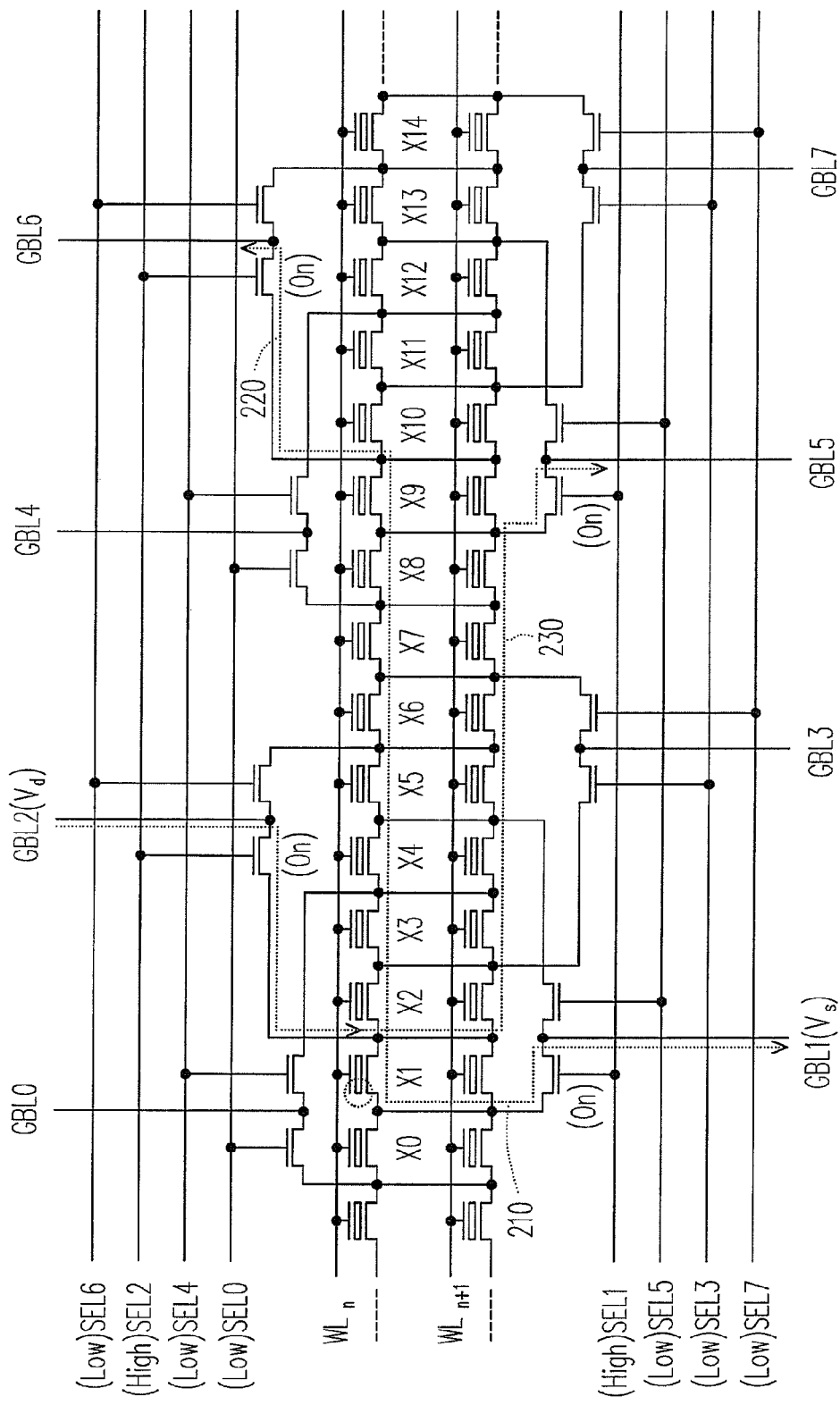
Figure 3:
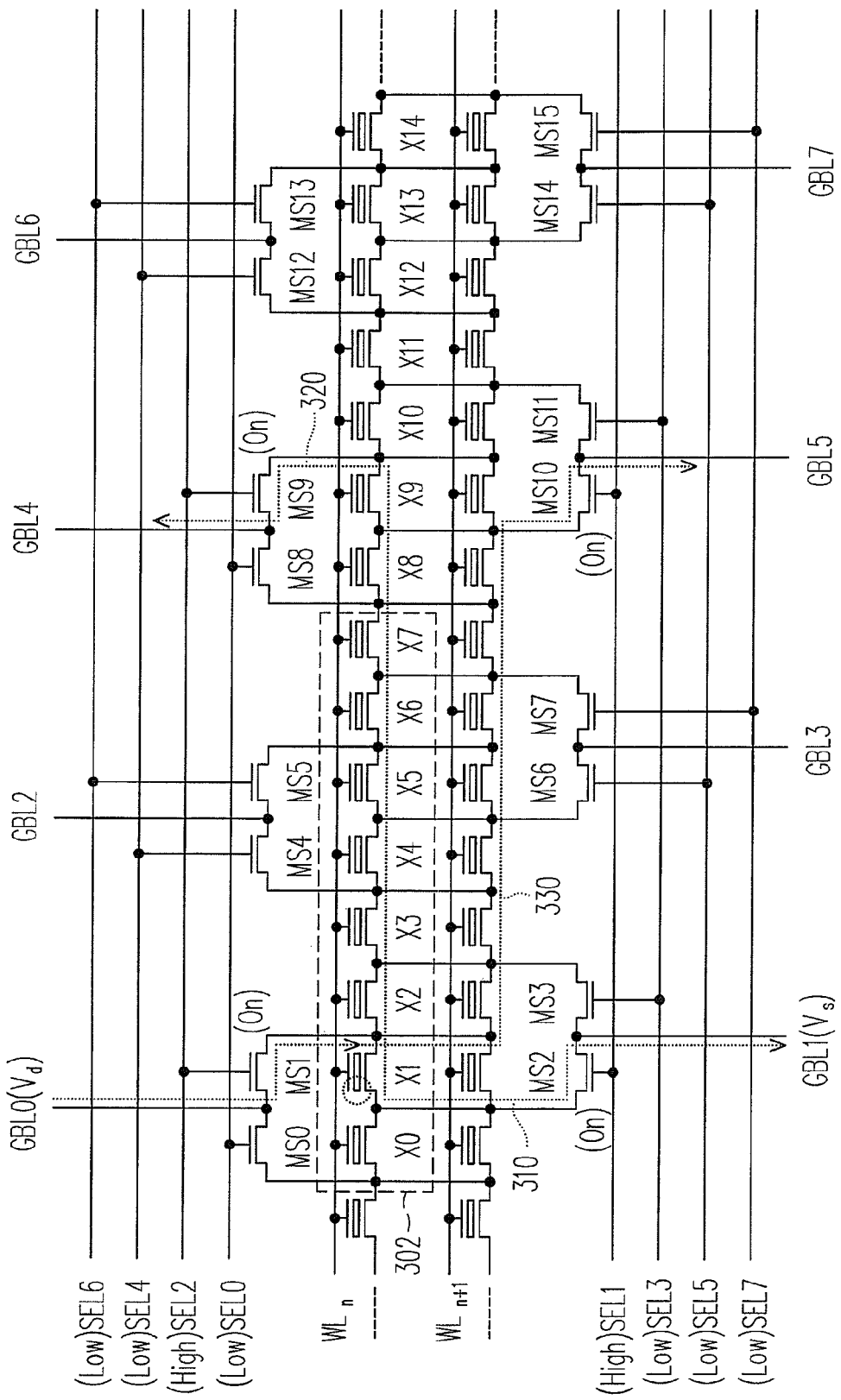
FIG. 3 depicts a virtual-ground NVM array according to an embodiment of this invention.

Such a virtual-ground NVM array is exemplified in FIG. 3, wherein $N_1=4$, $N_2=2$, $N_3=8$, and each of the $N_1$ global bit line is coupled to two doped regions at two sides of a pair of neighboring memory cells in a repeating unit via two select transistors and two bit lines. The global bit lines are usually metal lines.

Specifically, as shown in FIG. 3, the memory array includes a plurality of memory cells ( . . . , X0, X1, X2 . . . ) arranged in rows and columns, a plurality of word lines ( . . . $WL_n, WL_{n+1}$, . . . ), a plurality of bit lines, and a plurality of global bit lines (GBL0, GBL1, . . . ). The cells include doped regions as sources and drains, wherein any two neighboring cells (e.g., X0 and X1) in the same row share a doped region between them.

Each word line is coupled to the gate electrodes of a row of memory cells. For example, the word line $WL_n$ is coupled to the gate electrodes of the memory cells X0-X14 and other cells in the same row. Each bit line is coupled to a column of doped regions, as shown in FIG. 3.

Each global bit line is coupled to two bit lines via two select transistors that are coupled to different select lines by the gate electrodes thereof. For example, the global bit line GBL0 is coupled to two bit lines via the two select transistors MS0 and MS1 that are coupled to two different select lines SEL0 and SEL2 respectively by the gate electrodes thereof.

In view of the memory cells, each global bit line is coupled to two doped regions at two sides of a pair of neighboring memory cells in the same row. For example, the global bit line GBL0 is coupled to two doped regions at two sides of a pair of neighboring memory cells X0 and X1 in the same. Thereby, the source and the drain of any memory cell to be read are respectively coupled to two neighboring global bit lines. For example, the source and the drain of the memory cell X1 to be read are coupled to two neighboring global bit lines GBL0 and GBL1 respectively, and the source and the drain of the memory cell X3 to be read are coupled to two neighboring global bit lines GBL1 and GBL2 respectively.

Moreover, 8 (=$N_3$) consecutive cells, e.g., X0-X7, in a row constitute a repeating unit 302 of memory cells. The doped region of X0 not shared with X1 and the one shared by X1 and X2 are coupled to GBL0 via the select transistors MS0 and MS1 respectively. The doped region shared by X0 and X1 and the doped region shared by X2 and X3 are coupled to GBL1 via the select transistors MS2 and MS3 respectively. The doped region shared by X3 and X4 and the doped region shared by X5 and X6 are coupled to GBL2 via the select transistors MS4 and MS5 respectively. The doped region shared by X4 and X5 and the doped region shared by X6 and X7 are coupled to GBL3 via the select transistors MS6 and MS7 respectively. The eight select transistors MS0-MS7 are coupled to eight select lines SEL0-SEL7 respectively.

In addition, the eight doped regions in any other repeating unit (e.g., the one including the memory cells X8-X15 and another cell not shown) are coupled to another set of four global bit lines (e.g., GBL4-GBL7) in the same correspondence relationship in which the eight doped regions in the repeating unit of X0-X7 are coupled to GBL0-GBL3. Meanwhile, the correspondence relationship between the eight doped regions in any other repeating unit (e.g., the one including the cells X8-X15 and another cell not shown) and the eight select lines SEL0-SEL7 is the same as that between the eight doped regions in the repeating unit of X0-X7 and the eight select lines SEL0-SEL7.

Referring to FIG. 3 again, the states the respective global bit lines GBL0-GBL7 in reading different sides of different memory cells X0-X14 are listed in Table 2. For example, when the left side of X1 is to be read, the voltage of GBL0 is $V_d$, the voltage of GBL1 is $V_s$, a cell current 310 is formed, and one or both of two charging currents 320 and 330 may be formed to charge one or both of GBL4 and GBL5.

TABLE 2

|  | GBL0 | GBL1 | GBL2 | GBL3 | GBL4 | GBL5 | GBL6 | GBL7 |
|---|---|---|---|---|---|---|---|---|
| X0-[a]L | $V_s$ | $V_d$ | [c] |  | C | [d]C |  |  |
| X0-[b]R | $V_d$ | $V_s$ |  |  |  |  |  |  |
| X1-L | $V_d$ | $V_s$ |  |  | C | C |  |  |
| X1-R | $V_s$ | $V_d$ |  |  |  |  |  |  |
| X2-L | $V_s$ | $V_d$ |  |  | C | C |  |  |
| X2-R | $V_d$ | $V_s$ |  |  |  |  |  |  |
| X3-L |  | $V_s$ | $V_d$ |  |  | C | C |  |
| X3-R |  | $V_d$ | $V_s$ |  |  |  |  |  |
| X4-L |  |  | $V_s$ | $V_d$ |  |  | C | C |
| X4-R |  |  | $V_d$ | $V_s$ |  |  |  |  |
| X5-L |  |  | $V_d$ | $V_s$ |  |  | C | C |
| X5-R |  |  | $V_s$ | $V_d$ |  |  |  |  |
| X6-L |  |  | $V_s$ | $V_d$ |  |  | C | C |
| X6-R |  |  | $V_d$ | $V_s$ |  |  |  |  |
| X7-L |  |  | $V_s$ | $V_d$ |  |  |  | C |
| X7-R | C |  | $V_d$ | $V_s$ |  |  |  |  |
| X8-L |  |  |  |  | $V_s$ | $V_d$ |  |  |
| X8-R | C | C |  |  | $V_d$ | $V_s$ |  |  |
| X9-L |  |  |  |  | $V_d$ | $V_s$ |  |  |
| X9-R | C | C |  |  | $V_s$ | $V_d$ |  |  |
| X10-L |  |  |  |  | $V_s$ | $V_d$ |  |  |
| X10-R | C | C |  |  | $V_d$ | $V_s$ |  |  |
| X11-L |  |  |  |  | $V_s$ | $V_d$ |  |  |
| X11-R |  | C | C |  | $V_d$ | $V_s$ |  |  |
| X12-L |  |  |  |  |  |  | $V_s$ | $V_d$ |
| X12-R |  |  | C | C |  |  | $V_d$ | $V_s$ |
| X13-L |  |  |  |  |  |  | $V_d$ | $V_s$ |
| X13-R |  |  | C | C |  |  | $V_s$ | $V_d$ |
| X14-L |  |  |  |  |  |  | $V_s$ | $V_d$ |
| X14-R |  |  | C | C |  |  | $V_d$ | $V_s$ |

[a]: L = left side;
[b]: R = right side;
[c]: blank = floated;
[d]: C = possibly charged.

According to Table 2, when any memory cell is to be read with two neighboring main bits, the nearest global bit line possibly charged is separated from the two global bit lines by two other global bit lines. Since the source and the drain of any memory cell to be read are coupled to two neighboring global bit lines respectively, the global bit line with $V_s$ is always located between the global bit line with $V_d$ and a floated unselected global bit line, and the global bit line with $V_d$ is always located between the global bit line with $V_s$ and another floated unselected global bit line. In combination with the arrangement that the nearest possibly charged global bit line is separated from the two neighboring global bit lines by two other global bit lines, the GBL loading capacitances do not change when a different memory cell is to be read, thereby preventing wrong read behavior.

Figure 4:
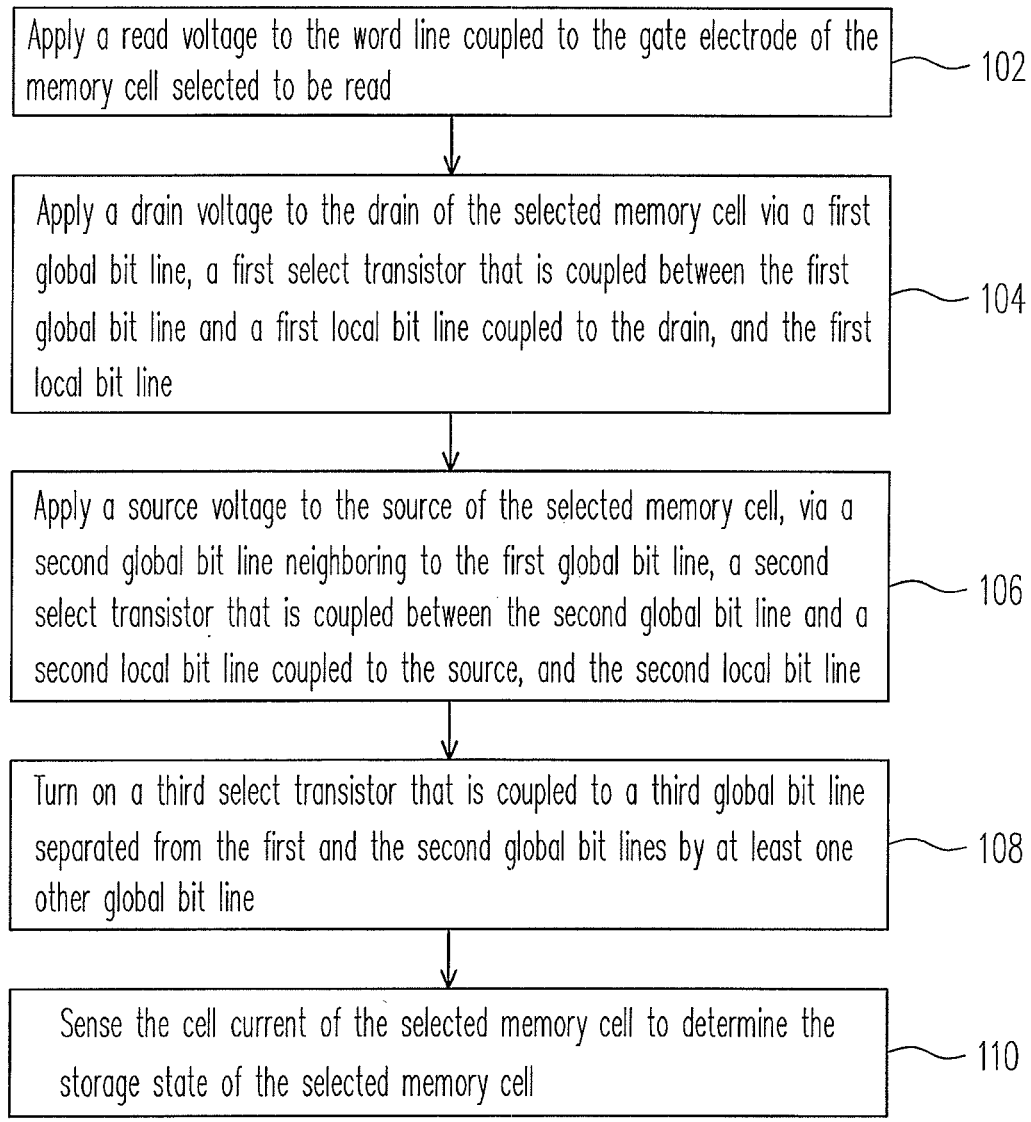
FIG. 4 is a flow chart showing a method of operating a memory according to an embodiment of this invention.

FIG. 4 is a flow chart showing a method of operating a memory according to an embodiment of this invention. It is particularly noted that though the steps 102-108 are described in the sequence shown in FIG. 4, they are not necessarily performed in the sequence. Moreover, reverse reading of the left side of the cell X1 in the memory array of FIG. 3 is taken as an example for the flow chart, wherein the left doped region of X1 acts as a source and the right doped region of X1 acts as a drain.

In step 102, a read voltage is applied to the word line coupled to the gate electrode of the selected memory cell to be read. Referring to FIG. 3, a read voltage is applied to the word line $WL_n$ that is coupled to the gate electrode of the memory cell X1 selected to be read. In a case where one side of a memory cell stores one bit, the read voltage is between the threshold voltage (Vt) corresponding to the 1-state and that corresponding to the 0-state.

In step 104, a drain voltage is applied to the drain of the selected memory cell, via a first global bit line, a first select transistor that is coupled between the first global bit line and a first local bit line coupled to the drain, and the first local bit line. Referring to FIG. 3, the drain voltage $V_d$ is applied to the drain of X1, via the global bit line GBL0, the select transistor MS1 that is coupled between the global bit line GBL0 and the local bit line coupled to the drain of X1, and the local bit line coupled to the drain of X1.

In step 106, a source voltage is applied to the source of the selected memory cell, via a second global bit line neighboring to the first global bit line, a second select transistor that is coupled between the second global bit line and a second local bit line coupled to the source, and the second local bit line. Referring to FIG. 3, the source voltage $V_s$ is applied to the source of X1, via the global bit line GBL1, the select transistor MS2 that is coupled between the global bit line GBL1 and the local bit line coupled to the source of X1, and the local bit line coupled to the source of X1.

In step 108, a third select transistor, which is coupled to a third global bit line separated from the first and the second global bit lines by at least one other global bit line, is turned on. Referring to FIG. 3, the select transistor MS9, which is coupled to the global bit line GBL4 separated from the global bit lines GBL0 and GBL1 by two other global bit lines GBL2 and GBL3, is turned on.

A fourth select transistor that is coupled to a fourth global bit line neighboring to the third global bit line may also be turned on. Referring to FIG. 3, the select transistor MS10 coupled to the global bit line GBL5 neighboring to GBL4 is also turned on.

In step 110, the cell current of the selected memory cell is sensed to determine the storage state of the selected memory cell. Referring to FIG. 3, the cell current 310 of the selected X1 is sensed to determine the storage state of the left side of X1.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A memory array, comprising:
   a first global bit line coupled to two doped regions at two sides of a first pair of neighboring memory cells via a first pair of select transistors, wherein the first pair of select transistors are coupled to a first pair of select lines;
   a second global bit line coupled to two doped regions at two sides of a second pair of neighboring memory cells via a second pair of select transistors, wherein the second pair of select transistors are coupled to a second pair of select lines; and
   a third global bit line coupled to two doped regions at two sides of a third pair of neighboring memory cells via a third pair of select transistors, wherein the third pair of select transistors are coupled to a third pair of select lines.

2. The memory array of claim 1, wherein the first pair of neighboring memory cells, the second pair of neighboring memory cells and the third pair of neighboring memory cells are all coupled to a word line.

3. The memory array of claim 2, wherein
the first global bit line is neighboring to the second global bit line,
the third global bit line is neighboring to the first or the second global bit line, and
the first pair of select lines, the second pair of select lines and third pair of select lines include six different select lines.

4. The memory array of claim 3, wherein
the first pair of neighboring memory cells shares a memory cell with the second pair of neighboring memory cells, and
the third pair of neighboring memory cells is separated from the first or the second pair of neighboring memory cells by another memory cell.

5. A memory array, comprising:
a plurality of select transistors controlled by eight select lines; and
a plurality of global bit lines coupled to doped regions of memory cells via the select transistors, wherein each of the global bit lines is coupled to two doped regions at two sides of two neighboring memory cells.

6. The memory array of claim 5, wherein memory cells in a row of the memory array are coupled to a word line.

7. The memory array of claim 6, wherein eight consecutive memory cells in a row of the memory array constitute a repeating unit, and are coupled to four global bit lines via eight select transistors each coupled to a different select line among the eight select lines.

8. The memory array of claim 7, wherein for a repeating unit,
the eight memory cells include first to eighth memory cells arranged in sequence, each of which shares a doped region with a neighboring memory cell,
the four global bit lines include first to fourth global bit lines arranged in sequence,
the first global bit line is coupled to the two doped regions at the two sides of the first and the second memory cells,
the second global bit line is coupled to the two doped regions at the two sides of the second and the third memory cells,
the third global bit line is coupled to the two doped regions at the two sides of the fifth and the sixth memory cells, and
the fourth global bit line is coupled to the two doped regions at the two sides of the sixth and the seventh memory cells.

* * * * *